(12) United States Patent
Ohsumi

(10) Patent No.: US 8,164,164 B2
(45) Date of Patent: Apr. 24, 2012

(54) SEMICONDUCTOR WAFER, AND SEMICONDUCTOR DEVICE FORMED THEREFROM

(75) Inventor: Takashi Ohsumi, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 36 days.

(21) Appl. No.: 12/887,798

(22) Filed: Sep. 22, 2010

(65) Prior Publication Data
US 2011/0006438 A1 Jan. 13, 2011

Related U.S. Application Data

(63) Continuation of application No. 11/441,196, filed on May 26, 2006, now Pat. No. 7,915,746.

(30) Foreign Application Priority Data

May 31, 2005 (JP) .................................. 2005158497

(51) Int. Cl.
*H01L 23/544* (2006.01)
*H01L 23/48* (2006.01)
*H01L 23/29* (2006.01)

(52) U.S. Cl. .................. 257/620; 257/758; 257/790

(58) Field of Classification Search .............. 257/620, 257/758, 790
See application file for complete search history.

(56) References Cited

U.S. PATENT DOCUMENTS

| 6,936,930 | B2 | 8/2005 | Wang |
| 7,109,093 | B2 * | 9/2006 | Fitzsimmons et al. ......... 438/427 |
| 7,157,799 | B2 | 1/2007 | Noquil et al. |
| 7,176,572 | B2 | 2/2007 | Hanaoka |
| 7,233,673 | B1 * | 6/2007 | Poletti ............................. 381/63 |
| 7,382,060 | B2 | 6/2008 | Farnworth et al. |
| 7,572,738 | B2 * | 8/2009 | Nogami ........................ 438/740 |
| 2004/0207014 | A1 | 10/2004 | Kishiro |
| 2004/0212047 | A1 * | 10/2004 | Joshi et al. ..................... 257/620 |
| 2004/0259306 | A1 | 12/2004 | Sakai et al. |
| 2004/0259325 | A1 | 12/2004 | Gan |
| 2005/0026397 | A1 * | 2/2005 | Daubenspeck et al. ........ 438/465 |
| 2005/0054133 | A1 | 3/2005 | Felton et al. |
| 2005/0145993 | A1 * | 7/2005 | Sasaki et al. .................. 257/620 |
| 2006/0012012 | A1 * | 1/2006 | Wang et al. .................... 257/620 |

FOREIGN PATENT DOCUMENTS

JP  11191541  7/1999

* cited by examiner

*Primary Examiner* — James Mitchell
(74) *Attorney, Agent, or Firm* — Volentine & Whitt, PLLC

(57) ABSTRACT

A semiconductor wafer has a substrate, and a plurality of active areas formed on the substrate. Integrated circuits are formed in the active areas. The semiconductor wafer also has dicing areas formed between the adjacent active areas. A seal ring is formed along the edge (periphery) of each active area. The semiconductor wafer also has interconnects formed closely to the inside of the seal ring. A protective layer covers the active areas. A protective film is formed on the protective layer at the locations of the active areas. The semiconductor wafer also has other interconnects formed on the protective film for electrical connection to the integrated circuits. Preferably, when the aspect ratio of a groove formed in the protective layer between the seal ring and the interconnect is 0.5 or more, this groove is covered with the protective film.

14 Claims, 2 Drawing Sheets

SEMICONDUCTOR WAFER, AND SEMICONDUCTOR DEVICE FORMED THEREFROM

CROSS-REFERENCE TO RELATED APPLICATIONS

This application is a divisional application of application Ser. No. 11/441,196 filed on May 26, 2006, which is hereby incorporated for all purposes.

BACKGROUND OF THE INVENTION

1. Field of the Invention

The present invention relates to a semiconductor wafer used for fabricating a wafer-level chip-size package-type semiconductor device, an IC chip having bump electrodes, or the like. The present invention also relates to a semiconductor device formed from such semiconductor wafer.

2. Description of the Related Art

In a conventional semiconductor wafer which is used for a wafer-level chip-size package-type semiconductor device or for an IC chip having bump electrodes, integrated circuits are formed on a plurality of element areas on a silicon substrate. Marks for measuring the pattern formation accuracy and elements for evaluating the electric characteristics are formed in dicing areas defined between adjacent element areas. The pattern formation accuracy measurement marks are partially covered with a protective layer when the protective layer for covering the element area is formed. Thus, damage of the resist film when second interconnects (re-wiring) are formed on the protective layer is prevented. The damage would occur if air was caught in a micro-space formed on a pattern formation accuracy measurement mark. Also, the cracking to be generated in the protective layer on an element area is prevented. Specifically, when the dicing area is cut by a dicing saw using free areas at predetermined spacing created between the protective layer which covers the pattern formation accuracy measurement mark and the protective layer which covers the element area, the cracking tends to be produced, but this cracking is prevented. This semiconductor wafer is disclosed in, for example, Japanese Patent Application Kokai (Laid-Open) No. 11-191541 (page 3, paragraph 0007 to page 4, paragraph 0013, FIG. 1 and FIG. 2).

Expectations to further downsize and increase production of wafer-level chip-size package-type semiconductor devices are increasing as electronic equipment sizes decrease and sales thereof expand recently.

In order to respond to further downsizing and increase in production of semiconductor devices, it is necessary to increase the number of semiconductor devices to be fabricated from one semiconductor wafer, by decreasing the size of semiconductor devices as a result of increasing the density of the integrated circuits formed on the semiconductor wafer, and by decreasing the size of the dicing area.

In the above described prior art, the cracking to be generated in the protective layer on the element area when the dicing area is cut by the dicing saw is prevented by the free areas defined at the predetermined distance between the protective layer of the dicing area and the protective layer of the element area. Therefore, if the dicing area is decreased, then the predetermined distance cannot be taken sufficiently large. If a groove of which aspect ratio (i.e., the thickness of the protective layer divided by the above-mentioned predetermined distance, or the depth divided by the width) is 0.5 or more, in other words if the depth of the groove is more than half the width is formed, the air caught in the groove swells when the resist film is pre-baked in the subsequent step of forming second interconnects, and resist film is damaged. Accordingly, plating precipitates in an undefined form at unexpected locations, which causes appearance defects, and the plate thickness of the second interconnects disperses.

When interconnects integrate power supply wires and are formed on an active area to downsize a semiconductor device, a seal ring is often formed in the active area outside the interconnects in order to stop the cracking of the protective layer from reaching the integrated circuit. If the seal ring is located close to the interconnects due to downsizing, a groove is formed in the protective layer between the seal ring and interconnects. If the aspect ratio of this groove is 0.5 or more, then resist film is damaged when the second interconnects are formed, as described above, and plating precipitates in an undefined form at unexpected locations. This causes appearance defects, and the plate thickness of second interconnects disperses.

SUMMARY OF THE INVENTION

It is one object of the present invention to provide a semiconductor wafer which can prevent the damage of resist film when second interconnects are formed, even if the aspect ratio of the groove formed in the protective layer is 0.5 or more.

According to one aspect of the present invention, there is provided a semiconductor wafer that includes a substrate, and a plurality of active areas defined on the substrate. Integrated circuits are formed in the active areas. The semiconductor wafer also includes dicing areas formed between the adjacent active areas. The semiconductor wafer also includes a seal ring formed along the edge (periphery) of each active area. The semiconductor wafer also includes first interconnects formed near the inner periphery of each seal ring. The semiconductor wafer also includes a protective layer covering the active areas, and a protective film formed on the protective layer such that the protective film extends over the active areas. The semiconductor wafer also includes second interconnects formed on the protective film for electrical connection to the integrated circuits. When the aspect ratio of a groove formed in the protective layer between the seal ring and the first interconnects is 0.5 or more, the groove is covered with the protective film.

The protective film that covers the groove of which the aspect ratio is 0.5 or more can prevent the damage of the resist film caused by gas remaining in the groove. Therefore, plating is not precipitated in an undefined form at unexpected locations, and the generation of appearance defects and the dispersion of the plate thickness of second interconnects can be prevented.

According to another aspect of the present invention, there is provided another semiconductor wafer. This semiconductor wafer includes a substrate, and a plurality of active areas formed on the substrate. Integrated circuits are formed in the active areas. Dicing areas are formed between adjacent active areas. The semiconductor wafer also includes a protective layer to cover the active areas and dicing areas. A plurality of guide grooves are formed in the protective layer. Each guide groove is formed by grooving the protective layer around each active area. The semiconductor wafer also includes a protective film covering the protective layer such that the protective film extends over the active areas. The semiconductor wafer also includes a plurality of interconnects formed on the protective film such that the second interconnects are electrically connected to the integrated circuits. When the aspect ratio of the guide groove is 0.5 or more, the guide groove is covered with the protective film.

These and other objects, aspects and advantages of the present invention will become apparent from the following detailed description and the appended claims when read and understood in conjunction with the accompanying drawings.

DETAILED DESCRIPTION OF THE INVENTION

Embodiments of the semiconductor wafer according to the present invention will now be described with reference to the drawings.

Embodiment 1

Figure 1:
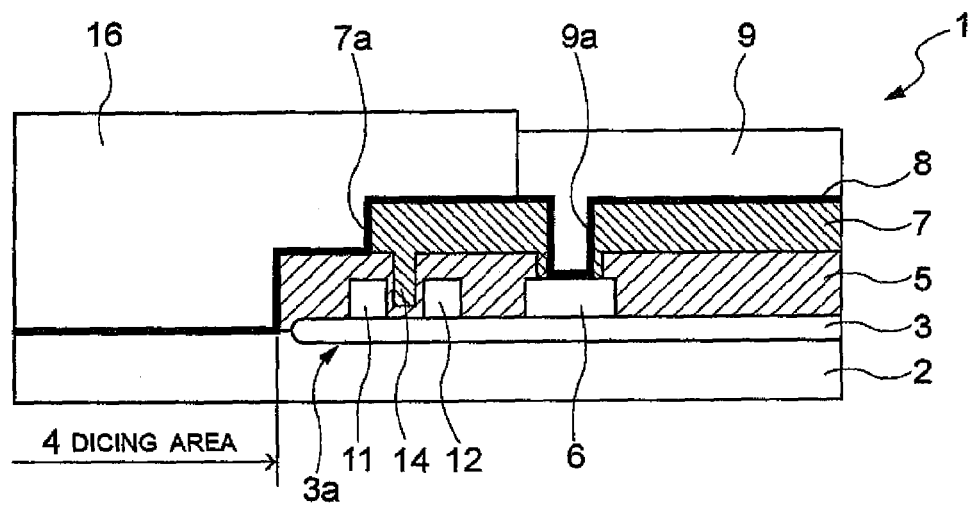
FIG. 1 is a partial cross-sectional view of the semiconductor wafer according to the first embodiment of the present invention, taken along the line I-I in FIG. 2.
Figure 2:
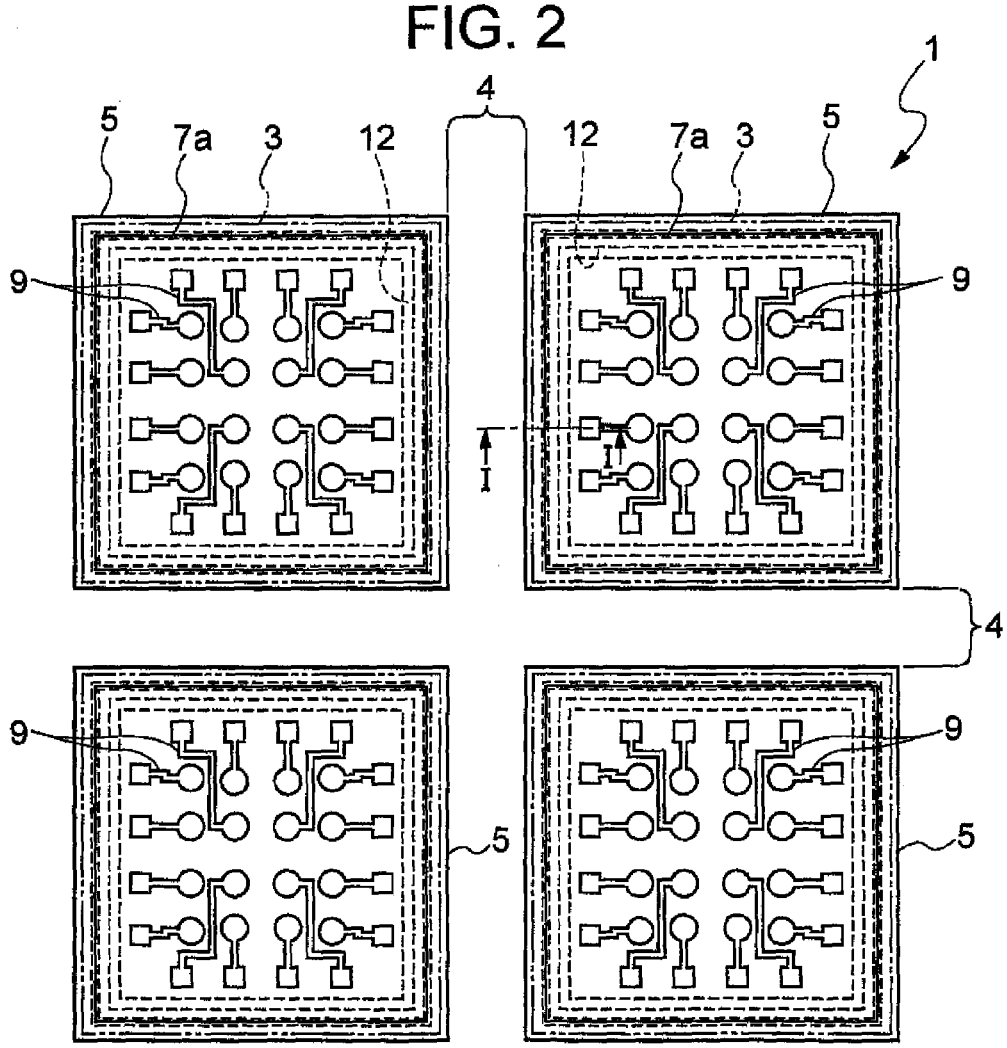
FIG. 2 is a top view depicting a part of the semiconductor wafer according to the first embodiment.

Referring to FIG. 1 and FIG. 2, a semiconductor wafer 1 of the first embodiment will be described. FIG. 1 is a partial enlarged cross-sectional view of the semiconductor wafer 1 after second interconnects are formed. FIG. 2 shows a plan view of part of the semiconductor wafer 1 when the resist film is removed after the second interconnects are formed. The semiconductor wafer 1 is used for fabricating the wafer-level chip-size package-type semiconductor device.

A semiconductor substrate 2 is made of silicon. On the upper face of the semiconductor substrate 2, a plurality of active areas 3 are formed. The active areas are areas where integrated circuits (not shown) can be formed. A dicing area 4, which is set as an area to be cut by a dicing saw when the wafer-level chip-size package-type semiconductor device is fabricated, is formed between the edges of the adjacent protective layers 5, i.e., between adjacent active areas 3.

The protective layer 5 is a so called "passivation film" made from silicon nitride ($Si_3N_4$) or silicon dioxide ($SiO_2$). The protective layer 5 is formed on the active areas 3 of the semiconductor substrate 2 and extends over the periphery of the electrode pads 6, as shown in the dotted area in FIG. 1. The protective layer 5 protects and insulates the integrated circuits formed at the center region of each active area 3 (right side in FIG. 1). Each electrode pad 6 is made from aluminum (Al) on the active area 3, and is electrically connected to a predetermined section of the semiconductor circuit formed on the active area 3.

A protective film 7 is made from a relatively strong organic material, such as polyimide resin, epoxy resin and polybenzo oxazole resin. The protective film 7 is formed on the protective layer 5 as shown by the meshed area in FIG. 1, and covers and smoothes the protective layer 5 and the defects, such as bumps, on the side faces of the holes formed in the protective layer 5 by etching. A seed layer 8 is a single or plurality of metal thin film layer(s) made from such metal material as nickel (Ni), titanium (Ti) or copper (Cu) and extends over the protective film 7, protective layer 5 and electrode pad 6, as the bold line in FIG. 1 shows. The seed layer 8 serves as one electrode when the second interconnects 9 are plated by an electrolytic plating method. The seed layer 8 prevents the material of the top layer, such as the second interconnects 9, from diffusing toward the semiconductor substrate 2 in the fabrication step of the semiconductor wafer 1. The seed layer 8 also improves contact with the second interconnects 9.

The second interconnects 9 are interconnects made from a conductive material, such as copper, and provided on the seed layer 8 on the protective film 7. The second interconnects 9 electrically connect with the electrode pad 6 via the protective layer 5 and the via hole 9a which penetrates through the protective film 7. The second interconnects 9 also electrically connect a post (not shown), which is formed at a predetermined position on the second interconnects 9, with the electrode pad 6.

A seal ring 11 is an annular element, made from aluminum, and provided on an area at the edge 3a of the active area 3 where the semiconductor circuit elements are not formed. The seal ring 11 stops the progress of cracking to be generated at the edge of the protective layer 5 when the dicing area 4 is cut by a dicing saw, so that cracking does not reach the integrated circuits.

The first interconnects 12 are formed in a ring with aluminum on the active area 3. The first interconnects 12 integrate the power supply wire to rationalize the circuit wiring of the integrated circuits. The first interconnects 12 are electrically connected to a predetermined location of an integrated circuit formed on the active area 3.

A groove 14 is formed in the protective layer 5 between the seal ring 11 and the interconnects 12 when the seal ring 11 and the interconnects 12 are covered with the protective layer 5.

A resist film 16 is a mask element formed by patterning resist material having a relatively high viscosity using photolithography when second interconnects 9 are formed. The resist film 16 has a positive type photosensitivity. Specifically, when the resist material is coated on the entire face of the semiconductor wafer 1 and is cured by heat in pre-bake, the portion exposed to light, such as ultraviolet, is altered and is dissolved in a developer.

It should be noted that FIG. 1 and FIG. 2 are diagrams with emphasis for easier understanding of the present embodiment, and the dimensions shown in the drawings are different from actual dimensions. The actual dimensions are quite small. For example, the height of the seal ring 11 and the interconnects 12 is about 2 μm, the spacing between the seal ring 11 and the interconnects 12 is about 2 μm, and the thickness of the protective layer 5 is less than 1 μm.

As described above, the groove 14 has a reduced width because of the protective layer 5, and the aspect ratio of the groove 14 (depth divided by width) is 0.5 or more. This means that the probability of air being caught in the groove 14 and the resist film 16 will be damaged when resist film 16 is formed is high. Thus, the protective film 7 is formed to fill and cover the groove 14.

It is preferable that the edge 7a of the protective film 7 positions at the center of the seal ring 11 in the width direction, and the width of the seal ring 11 is equal to a range from the upper limit to the lower limit of the fabrication accuracy of the edge 7a of the protective film 7. For example, if the fabrication accuracy of the edge 7a is ±3 μm, then the width of the seal ring 11 is 6 μm (+3 μm−(−3 μm)=6 μm). It can be prevented that the width of the dicing area 4 decreases due to the shifting of the edge 7a toward the dicing area 4 over the seal ring 11. It can also be prevented that the edge 7a cannot be formed with high quality due to the edge 7a reaching the edge of the active area 3. It can be also be prevented that the groove 14 cannot be covered due to the edge 7a not reaching the seal ring 11. The edge 7a is always positioned on the flat top face of the seal ring 11, and the edge 7a can be formed with high quality. The groove 14 can be covered with the protective film 7 with certainty.

It is preferable that the protective film 7 is made from the above mentioned organic material and has a thickness which withstands 1.5 atmospheric pressure or higher. The heat treatment temperature of pre-bake, for curing after resist material is coated when the resist film 16 is formed, is 100 to 150° C., and because of this heat treatment temperature, gas (e.g., air) caught in the groove 14 when the protective film 7 is formed, rises to a 1.27 to 1.44 atmospheric pressure by isochoric change. In order to withstand this pressure, the protective film 7 is preferably able to withstand 1.5 atmospheric pressure or higher.

In the present embodiment, the protective film 7 is formed with organic material. It should be noted, however, that the material to form the protective film 7 may be such an inorganic material as silicon nitride and silicon dioxide. Any material can be used as long as the material can implement the given functions of the protective film 7 and the resulting protective film 7 can withstand 1.5 atmospheric pressure or higher.

Now the fabrication method of a semiconductor device using the semiconductor wafer 1 of the present embodiment will be described.

A circular semiconductor substrate 2 is formed by slicing cylindrical silicon. The substrate 2 has a plurality of active areas 3. An integrated circuit (not shown) is formed at the center of each active area 3 of the semiconductor substrate 2 to prepare the semiconductor wafer 1. Then, an aluminum film is deposited on the entire upper face of the semiconductor substrate 2 by a sputtering method. This is etched into a predetermined shape of the seal rings 11, interconnects 12 and electrode pads 6, so that the seal rings 11, interconnects 12 and electrode pads 6 are formed on the active areas 3.

After forming of the seal rings 11, the protective layer 5 made of silicon dioxide is formed by a CVD (Chemical Vapor Deposition) method. Parts of the protective layer 5 at the locations of the electrode pads 6 and the dicing areas 4 are removed by etching. At the same time, a groove 14 is formed between the seal ring 11 and the interconnects 12 in the protective layer 5 in each active area.

On the protective layer 5 and the electrode pads 6, the protective film 7 made of polyimide resin is formed by a spin coat method. Then, parts of the protective film 7 at the locations of the electrode pads 6 are removed by etching to form through holes 9a which reach the electrode pads 6. Also, parts of the protective film 7 at the locations of the dicing area 4 side from the center in the width direction of the seal ring 11 are removed to expose the edge of the protective layer 5. The protective film 7 covering the groove 14 is thus formed.

The seed layer 8 is formed on the entire upper face of the semiconductor substrate 2 by a sputtering method, so that the exposed protective layer 5, protective film 7 and electrode pads 6 are covered with the seed layer 8. The resist film 16 is formed on the seed layer 8 by lithography to mask areas other than the locations where the second interconnects 9 are formed. Copper is precipitated on the exposed seed layer 8 by an electrolytic plating method, using the seed layer 8 as one electrode. The second interconnects 9 electrically connected to the electrode pads 6 are formed.

Even if the temperature rises during pre-bake for forming the resist film 16, the protective film 7 has sufficient withstanding pressure. Thus, the protective film 7 is not damaged by the increased pressure of the gas that may remain in the groove 14 when the protective film 7 is formed. Accordingly, the resist film 16 is not damaged.

Then the resist film 16 is removed by the stripper, and the exposed seed layer 8 is removed by plasma etching in an oxygen gas atmosphere, so as to expose the edge of the protective layer 5.

The dicing areas 4 of the semiconductor wafer 1 are recognized by detecting the edges of the protective layer 5, and the dicing areas 4 are cut by the dicing saw to separate the semiconductor wafer into chips. Thus, the semiconductor devices fabricated from the semiconductor wafer 1 of the present embodiment are obtained.

Then, the semiconductor device is sealed with such sealing resin as epoxy resin after bonding wires to predetermined locations of the second interconnects 9.

It should be noted that the way of forming the semiconductor device is not limited to the above described approach. For example, the semiconductor device may be formed in the following way. After the second interconnects 9 are formed and the resist film 16 is removed, identification marks, which indicate the cutting positions near the dicing areas 4, may be created by lithography (or posts may be created at predetermined locations of the second interconnects 9 by lithography). The seed layer 8 is removed and the upper face of the semiconductor substrate 2 is sealed with sealing resin. Then, the dicing areas 4 of the semiconductor wafer 1 may be cut by a dicing saw based on the identification marks (or the posts), and the wafer is separated into chips.

According to the present embodiment, if the aspect ratio of the groove formed in the protective layer between the seal ring, which is formed in each active area of the semiconductor wafer, and the interconnects is 0.5 or more, this groove is covered with the protective film. Therefore, even if the seal ring, for preventing the progress of cracking generated in the protective layer when the semiconductor wafer is separated into chips, and the interconnects for rationalizing the circuit wiring of the integrated circuit, are disposed close to each other, damage of the resist film due to the gas remaining in the groove defined between the seal ring and interconnects can be prevented by the protective film covering the groove. Accordingly, plating is not precipitated in an undefined form at unexpected locations, and the generation of appearance defects and the dispersion of plate thickness of the second interconnects can be prevented.

The edge of the protective film is positioned at the center of the seal ring in the width direction. Thus, a semiconductor wafer having the protective film with good quality can be acquired, with the edge of the protective film being positioned on the flat top face of the seal ring. Also, the groove can be covered with the protective film with certainty.

Because the width of the seal ring is equal to the range of the manufacturing accuracy of the edge of the protective film, the edge of the protective film can always be positioned on the flat top face of the seal ring.

Because the withstanding pressure of the protective film is set to a 1.5 atmospheric pressure or more, the damage of the protective film can be prevented with certainty, even if the pre-bake temperature of the resist film is 150° C. or more.

Because the protective film is formed with the organic material, such as polyimide resin, epoxy resin and polybenzo oxazole resin, the protective film having the above-mentioned withstanding pressure can easily be formed.

In the above-described embodiment, the seal ring and interconnects have the annular shape which extend along the entire periphery of the active area. However, a notch or overlapping areas may be formed in the seal ring and interconnects respectively, so as to prevent damage of the inorganic protective film due to the thermal expansion of the seal ring and interconnects.

In the first embodiment, the groove of which the aspect ratio is 0.5 or more is covered with the protective film. It should be noted that the same advantages can be obtained by filling the grooves with the protective layer when the aspect ratio is less than 0.5.

Embodiment 2

Figure 3:
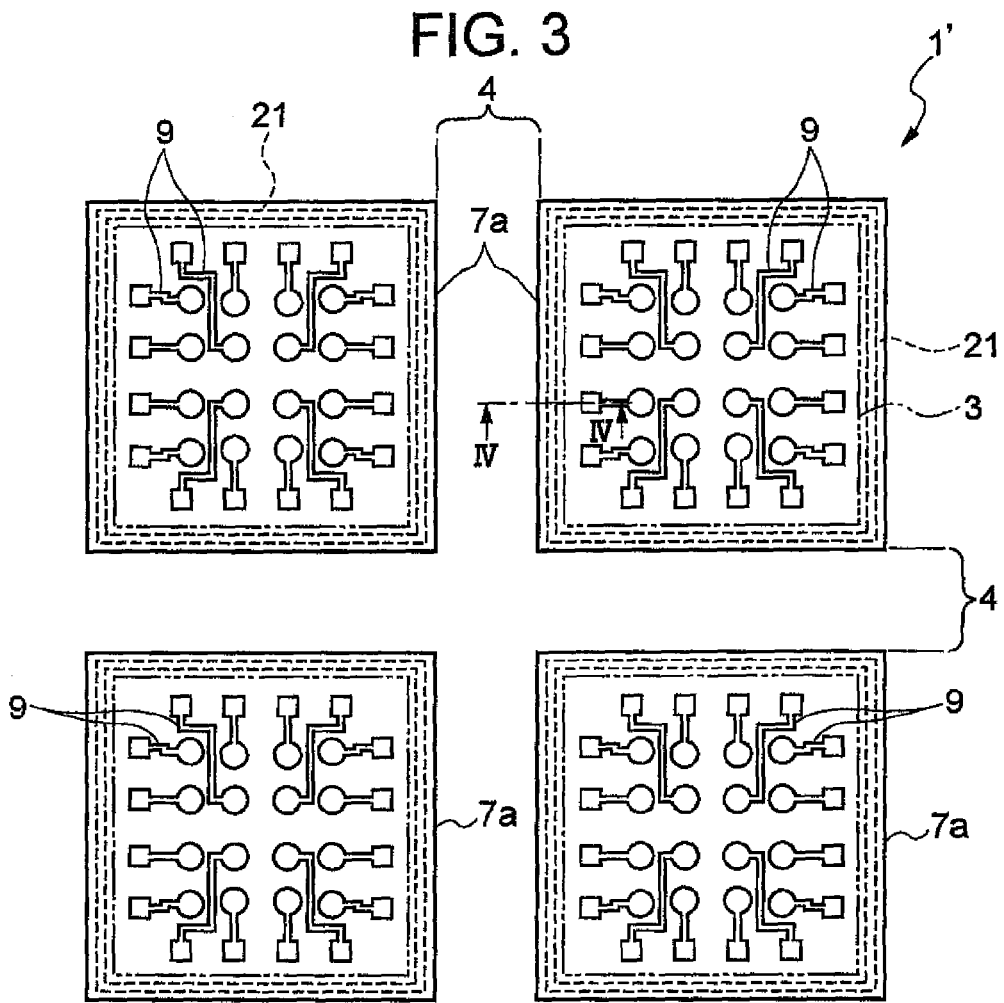
FIG. 3 is a top view of a part of the semiconductor wafer according to the second embodiment of the present invention.
Figure 4:
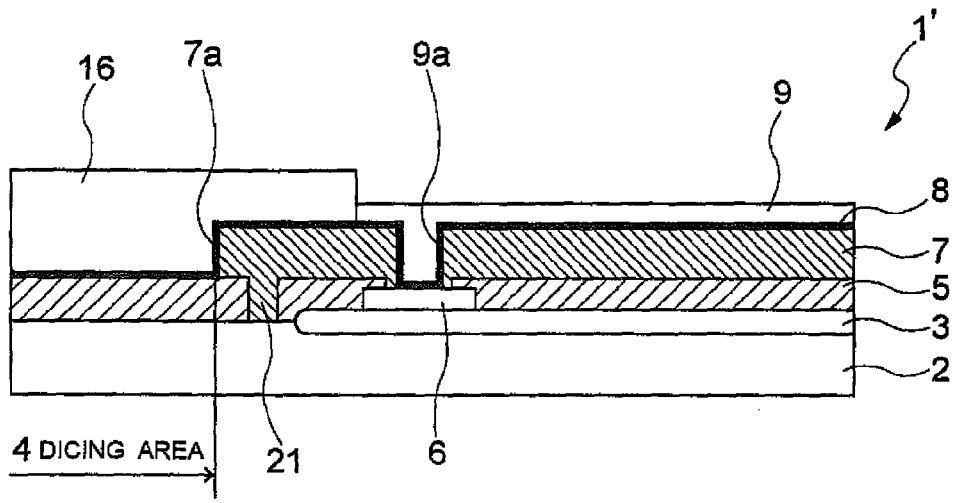
FIG. 4 is a partial cross-sectional view of the semiconductor wafer of the second embodiment, taken along the line IV-IV in FIG. 3.

Referring to FIG. 3 and FIG. 4, a second embodiment of the present invention will be described. FIG. 3 is a top view of a part of the semiconductor wafer 1' of the second embodiment, and FIG. 4 is a partial cross-sectional view of the semiconductor wafer 1'. In particular, FIG. 4 shows an enlarged view of the semiconductor wafer 1' after second interconnects are formed. FIG. 3 shows the status when the resist film is removed after the second interconnects are formed. Composing elements of the semiconductor wafer 1' of the second embodiment which are the same as the semiconductor wafer 1 of the first embodiment are denoted with the same reference symbols, of which description is omitted.

In FIG. 3 and FIG. 4, the protective layer 5 covers the active area 3 and the dicing area 4. A guide groove 21 is an annular groove formed in the protective layer 5 by etching the area between the active area 3 and the dicing area 4 so as to expose the upper face of the semiconductor substrate 2. The guide groove 21 indicates the cutting location by identifying the dicing area 4 when the dicing area 4 is cut by a dicing saw. The guide groove 21 also stops the progress of the cracking generated at the edge of the protective layer 5 when the protective layer 5 of the dicing area 4 and active area 3 is separated and the wafer is cut. Accordingly, the guide groove 21 prevents the cracking from reaching the integrated circuit.

The guide groove 21 is formed so that the aspect ratio of the guide groove 21 becomes 0.5 or more in order to downsize the semiconductor device and increase the number of units in fabrication. The protective film 7 is formed to cover the guide groove 21 for the same reason as the first embodiment. The dicing area 4 of the second embodiment is defined between the edges 7a of the protective films 7 of the adjacent active areas 3.

The protective film 7 of the second embodiment is formed with the same organic material as the first embodiment, and has a 1.5 atmospheric pressure or higher withstanding pressure.

Now the fabrication method of the semiconductor device using the semiconductor wafer 1' of the second embodiment will be described.

The step of preparing the semiconductor wafer 1, which has an integrated circuit formed at the center of each active area 3, is the same as the first embodiment.

An aluminum film is deposited on the entire upper face of the semiconductor substrate 2 of the semiconductor wafer 1' by sputtering. Then, this is etched into a predetermined shape of the electrode pads 6, so that electrode pads 6 are formed on the active areas 3.

After forming the electrode pads 6, the protective layer 5, made of silicon dioxide, is formed on the entire upper face of the semiconductor substrate 2 by a CVD method. The protective layer 5 at the locations of the electrode pads 6 is removed by etching. Also, the protective layer 5 at the area of the guide groove 21 between each active area 3 and the associated dicing area 4 is etched so that the upper face of the semiconductor substrate 2 is exposed, and the guide groove 21 is formed outside each active area 3.

The protective film 7 is formed on the protective layer 5 and the electrode pads 6 in the same way as the first embodiment. Via holes 9a are formed by etching. The protective film 7 in the dicing area 4, existing outside the guide groove 21, is removed to expose the protective layer 5. Thus, the protective film 7 covering the guide groove 21 is formed for each active area 3.

The seed layer 8 is formed in the same way as the first embodiment. The exposed protective layer 5, protective film 7 and electrode pads 6 are covered with the seed layer 8.

The resist film 16 is formed in the same way as the first embodiment. The second interconnects 9 are formed by electrolytic plating.

Even if the temperature rises during pre-bake for forming the resist film 16, the protective film 7 has sufficient withstanding pressure. Therefore, the protective film 7 is not damaged by the increased pressure of the gas that may remain in the guide groove 21 when the protective film 7 is formed. Accordingly, the resist film 16 is not damaged.

Subsequent steps are the same as the first embodiment, so description thereof is omitted.

In this way, the semiconductor devices are fabricated from the semiconductor wafer 1' of the second embodiment.

The dicing areas 4 of the semiconductor wafer 1' are detected by detecting the guide grooves 21.

Similar to the first embodiment, the upper face of the semiconductor wafer 1' of the second embodiment may be sealed with sealing resin, and the semiconductor wafer 1' may be separated into chips.

According to the second embodiment, if the aspect ratio of the guide groove formed outside the active area of the semiconductor wafer is 0.5 or more, this guide groove is filled and covered with the protective film. Thus, the progress of cracking generated in the protective layer when the semiconductor wafer is separated into chips using the guide grooves can be prevented by the protective film, and the damage of the resist film due to gas remaining in the guide groove can be prevented by the protective film covering the guide groove. Therefore, plating is not precipitated in an undefined form at unexpected locations, and the generation of appearance defects and the dispersion of plate thickness of the second interconnects can be prevented.

The protective film is formed with organic material, such as polyimide resin, epoxy resin and polybenzo oxazole resin, and the withstanding pressure thereof is set to 1.5 atmospheric pressure or more. Therefore, the damage of the protective film can be prevented with certainty, even if the pre-bake temperature of the resist film is 150° C. Also, the protective film having the above-mentioned withstanding pressure can easily be formed.

In the second embodiment, the guide groove of which the aspect ratio is 0.5 or more is covered with the protective film. It should be noted that the same advantages can be obtained by filling the guide grooves with the protective layer when the aspect ratio is less than 0.5.

In the first and second embodiments, a semiconductor wafer, to be used for fabricating the wafer-level chip-size package-type semiconductor device, is described as an example, but the present invention can be applied in the same way to the semiconductor wafer to be used for fabricating the IC chip having bump electrodes.

This application is based on Japanese Patent Application No. 2005-158497 filed on May 31, 2005 and the entire disclosure thereof is incorporated herein by reference.

What is claimed is:
1. A semiconductor device comprising:
a substrate having an integrated circuit therein;
an electrode disposed on the substrate and electrically connected to the integrated circuit;

a blocking member disposed on a periphery of the substrate;
a first wiring layer disposed on the substrate and between the electrode and the blocking member, the first wiring layer being adapted to receive a power supply voltage;
a passivation layer on the substrate that covers the integrated circuit, the blocking member and the first wiring layer, the passivation layer having a groove between the blocking member and the first wiring layer and also having a first via hole therein, wherein a surface of the electrode is exposed in the first via hole, and the blocking member prevents cracking generated in an end of the passivation layer from progressing toward the integrated circuit;
a protective layer on the passivation layer to fill the groove of the passivation layer and on a side of the passivation layer in the first via hole, the protective layer having a second via hole therein, wherein a portion of the surface of the electrode is exposed in the second via hole; and
a second wiring layer disposed on the protective layer and electrically connected to the integrated circuit through the first and second via holes.

2. The semiconductor device according to claim 1, wherein an edge of the protective layer is located over a center of the blocking member in a width direction of the blocking member.

3. The semiconductor device according to claim 2, wherein a width of the blocking member to the edge of the protective layer is equivalent to a range from an upper limit to a lower limit of fabrication accuracy.

4. The semiconductor device according to claim 1, wherein the protective layer has a withstanding pressure of 1.5 atmospheric pressure or higher.

5. The semiconductor device according to claim 1, wherein the protective layer is made from polyimide resin, epoxy resin, polybenzo oxazole resin, silicon nitride or silicon dioxide.

6. The semiconductor device according to claim 1, wherein the protective layer is made from $Si_3N_4$ or $SiO_2$.

7. The semiconductor device according to claim 1, wherein the protective layer is made from an organic material having a relatively high intensity.

8. The semiconductor device according to claim 1, wherein the blocking member is made from aluminum.

9. A semiconductor device comprising:
a substrate having an integrated circuit therein;
an electrode disposed on the substrate and electrically connected to the integrated circuit;
a passivation layer on the substrate that covers the integrated circuit, the passivation layer having a groove adjacent to the integrated circuit and also having a first via hole on the electrode, with a portion of a surface of the substrate being exposed in the groove and a surface of the electrode being exposed in the first via hole, wherein the groove prevents cracking in an end of the passivation layer from progressing toward the integrated circuit;
a protective layer on the passivation layer to fill the groove of the passivation layer and on a side of the passivation layer in the first via hole, the protective layer having a second via hole therein, wherein a portion of the surface of the electrode is exposed in the second via hole; and
a second wiring layer disposed on the protective layer and electrically connected to the integrated circuit through the first and second via holes.

10. The semiconductor device according to claim 9, wherein the protective layer is made from polyimide resin, epoxy resin, polybenzo oxazole resin, silicon nitride or silicon dioxide.

11. The semiconductor device according to claim 9, wherein the protective layer has a withstanding pressure of 1.5 atmospheric pressure or higher.

12. The semiconductor device according to claim 9, wherein the protective layer is made from $Si_3N_4$ or $SiO_2$.

13. The semiconductor device according to claim 9, wherein the protective layer is made from an organic material having a relatively high intensity.

14. The semiconductor device according to claim 9, wherein the blocking member is made from aluminum.

* * * * *